United States Patent [19]

Case et al.

[11] Patent Number: 5,790,835

[45] Date of Patent: Aug. 4, 1998

[54] PRACTICAL DISTRIBUTED TRANSMISSION LINE ANALYSIS

[75] Inventors: Ronald Keith Case, Colchester; Donald Lee Jordan, Middlebury; Sue Ellen Strang, Burlington, all of Vt.

[73] Assignee: International Business Machines Corporation, Armonk, N.Y.

[21] Appl. No.: 582,838

[22] Filed: Jan. 2, 1996

[51] Int. Cl.$^6$ .............................. G06F 9/455; G06F 17/50
[52] U.S. Cl. .............................................................. 395/500
[58] Field of Search ............................ 395/500; 364/578, 364/488–491

[56] References Cited

U.S. PATENT DOCUMENTS

| | | | |
|---|---|---|---|
| 4,852,160 | 7/1989 | Kiko et al. | 379/405 |
| 5,010,493 | 4/1991 | Matsumoto et al. | 364/490 |
| 5,025,402 | 6/1991 | Winkelstein | 364/578 |
| 5,243,547 | 9/1993 | Tsai et al. | 364/578 |
| 5,379,232 | 1/1995 | Komoda | 364/489 |
| 5,502,392 | 3/1996 | Arjavalingam et al. | 324/638 |
| 5,519,755 | 5/1996 | Meyer | 379/10 |

*Primary Examiner*—Kevin J. Teska
*Assistant Examiner*—Ayni Mohamed
*Attorney, Agent, or Firm*—Schmeiser, Olsen & Watts; Richard M. Kotulak

[57] ABSTRACT

A system and method is provided for that allows the introduction of small sections of idealized conductive elements to be placed along a transmission line. The output is a partitioned transmission line whose segments between the idealized conductive elements are analyzed via circuit simulators as a distributed parasitic network, as opposed to the widely used lumped parasitic elements approach for the entire line. The distributed parasitic network system and method provides circuit designers with a parasitic extraction tool which allows the designer to define a transmission line segment for analysis, and create sub-networks of parasitic elements across the transmission line. These elements can then be passed to existing vendor circuit simulators for parasitic analysis, the result of which are more accurate than that derived using existing extraction tools whose output is limited to only a lumped parasitic parameter along the line.

5 Claims, 2 Drawing Sheets

PRACTICAL DISTRIBUTED TRANSMISSION LINE ANALYSIS

BACKGROUND OF THIS INVENTION

1. Technical Field

This invention generally relates to the simulation of electrical circuits, and more specifically relates to distributed transmission line analysis.

2. Background Art

The design verification cycle using computer simulation tools continues to be a critical step in the production of integrated circuit chips. With today's integrated circuit devices containing millions of transistors, present simulation tools strive to simplify nodal analysis in order to save computational time. To achieve this, computer based analysis tools utilize optimizing routines which lump together portions of the circuit to reduce complexity.

However, as the demand for integrated circuits operating at higher frequencies increases, and as wavelengths approach design dimensions, it is often desirous to obtain more complicated analysis results on specific portions of a circuit. In particular, the need for accurate distributed line or transmission line analysis has arisen in those cases where a transmission line approaches, or is greater in length than the wavelength of the signal being transmitted thereon.

Because current vendor integrated circuit design tools attempt to simplify complicated circuits, they fail to provide a means for generating accurate transmission line analysis. The specialized tools that do exist for transmission line analysis are generally limited to frequency analysis only.

As noted above, because current integrated circuit design tools are designed to reduce the complexity of circuits by lessening the number of nodes, the designer is limited to lumped node analysis. Furthermore, the physical dimensions of a transmission line (or "net") relative to the wavelength of the signals being propagated on it are not part of the criteria used for analysis. Therefore, analysis of transmission lines or nets having lengths that approach, or are greater than the wavelength of signals propagated along them is limited to lumped parameter analysis for major sections of the lines. Thus, critical design issues resulting from high frequencies and relating to parasitic resistance and the like may be completely ignored by present art systems.

An example of such a system is disclosed in U.S. Pat. No. 5,243,547 issued to Tsai et al. on Sep. 7, 1993 entitled "Limiting Parasitic Signal Coupling Between Conductors." This patent provides a method for performing circuit analysis by developing lumped parameter models for circuit portions, and then forming an equivalent circuit by serially connecting the models for each portion. While '547 discloses a method for performing transmission line analysis, it does not teach a means for individually analyzing or creating "sub-portions" of the transmission line.

Therefore, there exists a need to provide for an improved system wherein sections of conductive transmission lines can be analyzed in a distributed manner. In particular, a system is needed wherein either the user or the system can choose transmission lines on which distributed line analysis can take place. The aforementioned prior art is hereby incorporated by reference.

DISCLOSURE OF INVENTION

The present invention provides a system and method for allowing a designer to place a multiplicity of conductive elements along any transmission line so that distributed parameter analysis can be performed. The invention utilizes the current ability of vendor design systems to recognize elements such as terminals, cuts, and vias, and then allows for the creation of additional design layers specific to those conductive elements. The result is a distributed parasitic network.

The distributed parasitic network system and method may be incorporated into any design tool such as that sold by CADENCE DESIGN SYSTEMS., INC. It is presumed that one skilled in this art is familiar with such tools and their operation, and has a fundamental understanding of the source code that provides their functionality. Operation of these tools typically occurs on a computer system that allows an end user to build and display a circuit by choosing parts such as transmission lines, layers and vias. They also provide a means for analyzing the circuit and displaying the results.

Such tools calculate an RC (or RLC) network with compensation for bends and transitions in geometry. The RC network output is then reduced to its simplest form, e.g. a single network for a simple net with two terminal points. Without modification, such tools would output lumped parasitic parameters for major sections of all lines. By implementing the distributed parasitic network system and method into such tools, designers can create a multiplicity of conductive elements along any transmission line for distributed parameter analysis of that line.

Pursuant to this invention, design rules are modified to recognize additional conductive elements and induce the RC networks to stop at, and preserve the added nodes, and to pass these "sub-nodes" and "sub-elements" to the vendor circuit simulator for standard modeling. While focus is drawn to a system and methodology for use with the CADENCE design system parasitic extraction tool, the invention can just as easily be adapted for use on any vendor system. It should also be noted that this system and methodology are not limited to integrated circuit design systems, but can be adapted for analysis of other distributed networks.

In accordance with the above, it is an advantage of the present invention to provide a method for allowing existing circuit simulators to perform distributed line analysis.

In accordance with the above, it is a further advantage of the present invention that the addition of design layers do not interfere with the normal production of the design and will not cause any false connectivity to other layers.

In accordance with the above, it is a further advantage of the present invention to provide a system wherein the designer can define transmission line segments for analysis and create sub-networks of parasitic elements across transmission lines.

In accordance with the above, it is a further advantage of the present invention to provide a system wherein information gathered under this method can be passed to existing vendor circuit simulators for parasitic analysis.

The foregoing and other objects, features and advantages of the invention will be apparent from the following more particular description of (a) preferred embodiment(s) of the invention, as illustrated in the accompanying drawing(s).

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
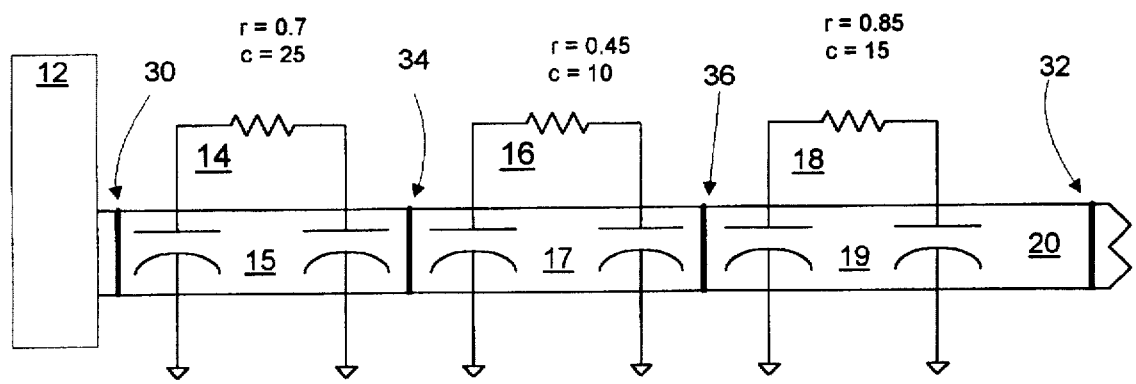
FIG. 1 depicts the output of an analysis tool showing a transmission line analyzed with a distributed RC network.
Figure 2:
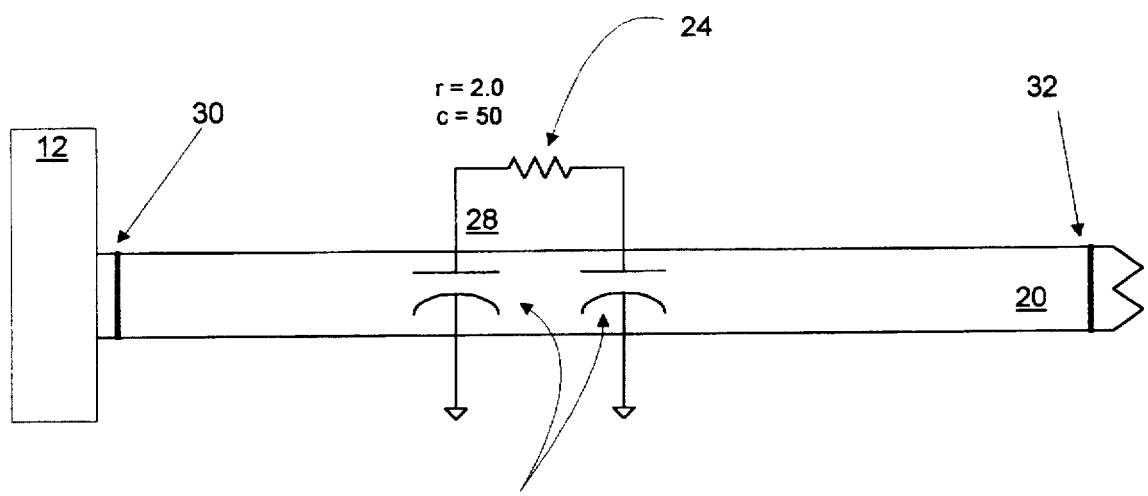
FIG. 2 depicts the output of an analysis tool showing a transmission line analyzed with a lumped parasitic RC network.

Referring now to the figures, FIGS. 1 and 2 depict two circuit simulator outputs showing the same simulated transmission line or "net" 20 extending from device 12. In a typical system, a simulated circuit containing transmission lines are drawn and appear on a computer screen. Portions of the circuit, or particular transmission lines can then be chosen for analysis. As shown in FIGS. 1 and 2, simulated transmission line 20 begins at a first terminal point 30 and ends at a second terminal point 32. FIG. 1 depicts an output analyzed as a distributed network pursuant to the present invention, while FIG. 2 depicts an output analyzed as a lumped parameter network.

Referring first to FIG. 2, transmission line 20 has no additional nodes, cuts or vias designed in between the two terminal points 30 and 32. Therefore, existing transmission line analysis tools will automatically reduce transmission line 20 into a single line or net and output lumped parameter data 28.

As shown in FIG. 2, lumped analysis data will display the electrical characteristics of the entire transmission line 20 in the form of a single resistor-capacitor (RC) network 28. As shown, the RC model includes a resistor 24 and a pair of capacitors 22. The RC network 28 includes resistive and capacitive values that allow the designer to factor such characteristics as parasitic resistance into their design. As discussed above however, increased performance demands often make it desirous to obtain more detailed information regarding a given transmission line or net.

FIG. 1 discloses the result of the present invention which allows for distributed transmission line analysis. FIG. 1 depicts a system wherein pseudo nodal points 34 and 36 are placed onto the transmission line 20 either by the end-user or by an automated process. This allows the transmission line 20 to be cut into transmission line or net segments 15, 17 and 19 such that multiple or distributed analysis 14, 16 and 18 can be performed.

The desired distributed analysis system can be incorporated into existing design tools by making various design rule modifications. First, the rules must be modified so that the designer can create and place a multiplicity of conductive elements or nodes (e.g. 34 and 36) along any transmission line (e.g. 20). The system must include a means for recognizing these "additional" conductive element so that the system can stop at, and preserve these added nodes. Finally, the system must be modified to pass the nodes to a vendor's circuit simulator for standard modelling. These steps are discussed in more detail with respect to FIG. 3 below.

Figure 3:
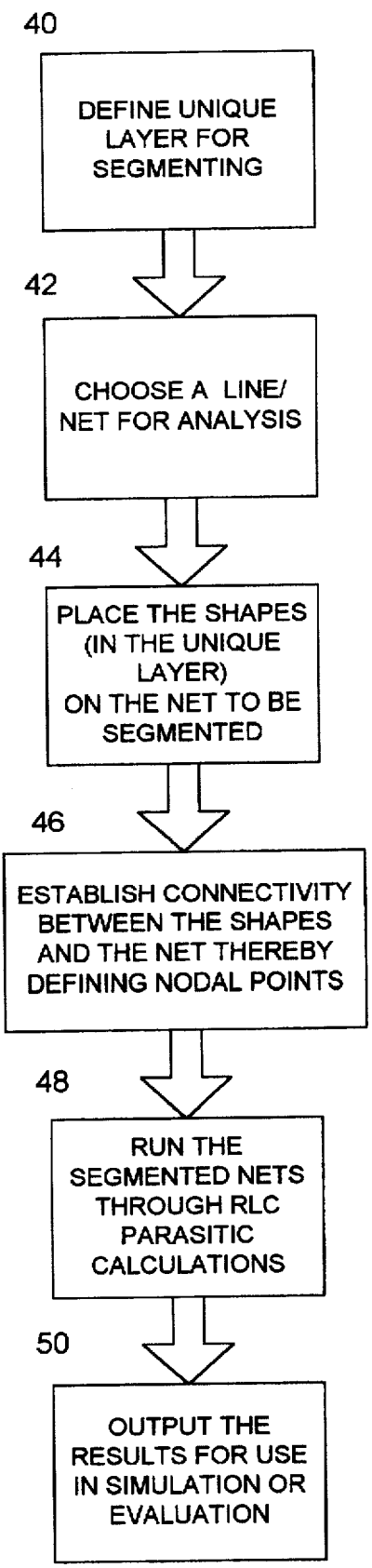
FIG. 3 is a flow chart depicting a method of implementing and performing distributed parasitic network analysis in accordance with the present invention.

FIG. 3 depicts a flow diagram that illustrates the steps required to perform distributed line analysis. The first step, shown as box 40, requires the definition of a unique layer and shape for segmenting which the program will recognize. In other words, some type of pseudo nodal point (e.g. 34 and 36 of FIG. 1) must be defined for later access either by the end user or by an automated process. Examples may include pseudo-vias, pseudo-cuts, and pseudo-terminals. In the CADENCE system, the new definition would be added to their "Technology File" which contains the predefined layers.

The next step 42 requires the user to choose a transmission line or net (e.g., 20 of FIG. 1) for segmentation by the shapes in the unique layer (i.e. the pseudo nodal points). This step is typically performed by the end user with a graphics editor or CAD system. However, it is possible that a software program could automatically determine which nets need to be further segmented based on some criteria such as line length.

This is followed by step 44 wherein the pseudo nodal points are placed onto the net. This could either be done manually by an end user or automatically by the system. Automatic placement may be based upon mathematical formulations which determine the optimum position. Under the CADENCE system, the verification code must be modified to allow for the temporary storage of pseudo nodal point information which gets produced during this step.

Next, under step 46, connectivity is established between the shapes and the nets such that the shapes now define nodal points which segment the net. In order for connectivity to occur under the CADENCE system, changes to the verification code must be incorporated such that the stored pseudo nodal point information is processed during parasitic calculations.

Next, under step 48, the segmented net is analyzed by running it, through RLC (or RC) parasitic calculations and finally, under step 50, the results (e.g. FIG. 1) are outputted and available for use in simulation or evaluation.

As noted above, under the CADENCE system, changes to the verification code must be made to achieve the desired results. Information regarding a predefined unique layer (e.g. "segment" "drawing") may be stored initially in a temporary variable (e.g. TR) as follows:

TR=geomOr(geomGetPurpose("segment" "drawing" 0 25)).

A pseudo-via (TR) and an additional metal view (m1) for an idealized conductive element may be permanently created/stored by adding the following statements:

TRvia=geomAnd(TR m1) and

TRmtl=geomOr(TRvia).

The desired net and its associated pseudo vias are then passed to the standard system function for segmenting. The following is a sample of the standard CADENCE function that will do segmenting:

measureResistance(m1TR "rcNet auLvs" nnn "r" ( cap "c" nnn * a+nnn * p) (save "m1");

[note: nnn = a floating point coefficient].

Finally, the shapes are passed through net processing to create an idealized conductive element (i.e., step 46 of FIG. 3) using the following statement:

geomConnect(via(TRvia m1TR TRmtl)).

It is recognized that the aforementioned code statements merely provide an example of how the present method can be incorporated into one existing vendor system. It is further recognized that one skilled in the art could understand and apply these or similar statements. It is also recognized that the spirit and scope of the invention need not be utilized solely as a modification of an existing system, but could be included as a feature in a new product.

While the invention has been particularly shown and described with reference to (a) preferred exemplary embodiment(s) thereof, it will be understood by those skilled in the art that various changes in form and details may be made therein without departing from the spirit and scope of the invention.

It will be understood that, while various conductors (connections) are shown in the drawing as single lines, they are not so shown in a limiting sense, and may comprise plural conductors (connections), as is understood in the art.

We claim:

1. A method for implementing and performing distributed transmission line analysis with a transmission line analysis tool comprising the steps of:

predefining at least one unique layer in a source code file containing layer definitions to define at least one pseudo nodal point;

including a means for establishing connectivity between a transmission line and said at least one pseudo nodal point;

selecting said transmission line from a plurality of predesigned transmission lines;

placing an at least one geometric shape into said unique layer;

choosing said one of said at least one pseudo nodal points;

locating said one of said at least one pseudo nodal points onto said transmission line;

establishing connectivity between said transmission line and said one of at least one pseudo nodal point;

creating a segmented transmission line; and performing a distributed line analysis on said segmented transmission line.

2. The method of claim 1 wherein said transmission line analysis tool is a parasitic extraction design tool.

3. The method of claim 1 wherein said transmission line comprises a substantially uniform geometric shape with two terminal points.

4. The method of claim 1 wherein said distributed line analysis comprises RLC parasitic calculations.

5. The method of claim 1 wherein said plurality of predesigned transmission lines comprise computer simulated integrated circuit transmission lines.

* * * * *